United States Patent [19]

Sohval et al.

[11] Patent Number: 4,458,180

[45] Date of Patent: Jul. 3, 1984

[54] PLASMA ELECTRON SOURCE FOR COLD-CATHODE DISCHARGE DEVICE OR THE LIKE

[75] Inventors: A. Robert Sohval, Cambridge, Mass.; Gerald Cooperstein, Rockville, Md.; David Fleischer, Boxford, Mass.; Shyke A. Goldstein, Gaithersburg, Md.; David R. Hearn, Wellesley, Mass.

[73] Assignee: Elscint Ltd., Haifa, Israel

[21] Appl. No.: 349,766

[22] Filed: Feb. 18, 1982

[51] Int. Cl.³ .............................................. H01J 29/04
[52] U.S. Cl. ........................... 315/111.81; 313/231.41; 315/111.21
[58] Field of Search ....................... 315/111.21, 111.31, 315/111.81; 313/230, 231.41, 359, 363; 378/122, 134; 250/426

[56] References Cited

U.S. PATENT DOCUMENTS

| | | | |
|---|---|---|---|
| 3,153,175 | 10/1964 | Winzeler | 315/111.21 |
| 3,323,002 | 5/1967 | Lafferty | 313/231.41 X |
| 3,678,334 | 7/1972 | Dugdale et al. | 315/111.81 |
| 3,702,416 | 11/1972 | Bex et al. | 313/230 X |

Primary Examiner—Eugene R. LaRoche
Attorney, Agent, or Firm—Sandler & Greenblum

[57] ABSTRACT

A plasma electron source has an apertured cathode, and a housing for defining a cavity behind the aperture. A trigger electrode, in communication with the cavity, is responsive to a short-duration trigger pulse for establishing plasma in the cavity. The plasma is sustained in the cavity subsequent to the termination of the trigger pulse by a bias circuit, which biases the cavity at a relatively low voltage with respect to the cathode for a period of time much longer than the duration of the trigger pulse.

35 Claims, 17 Drawing Figures

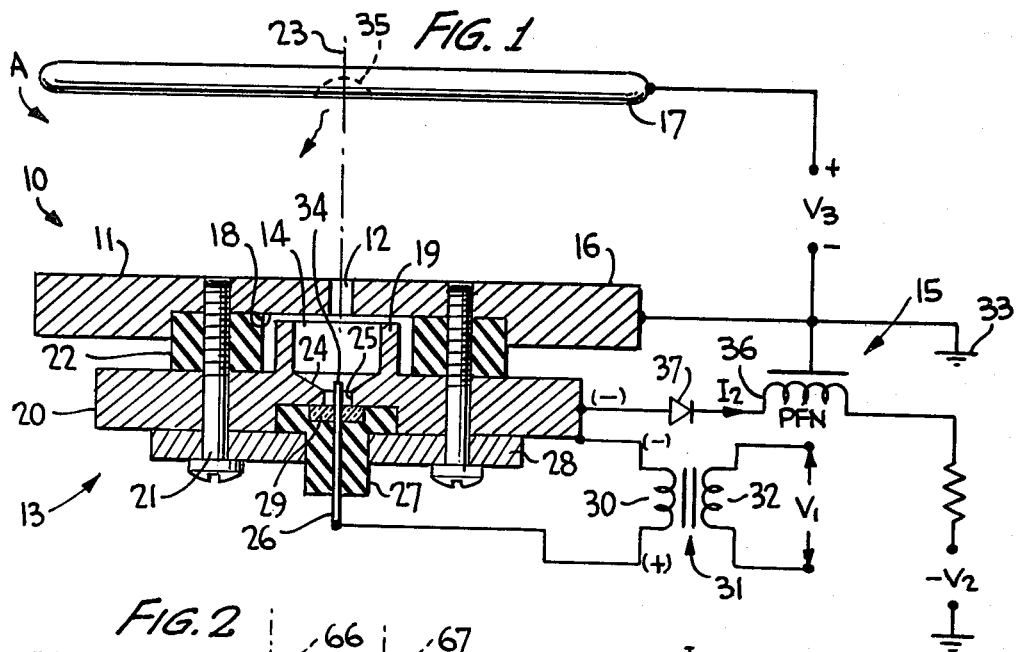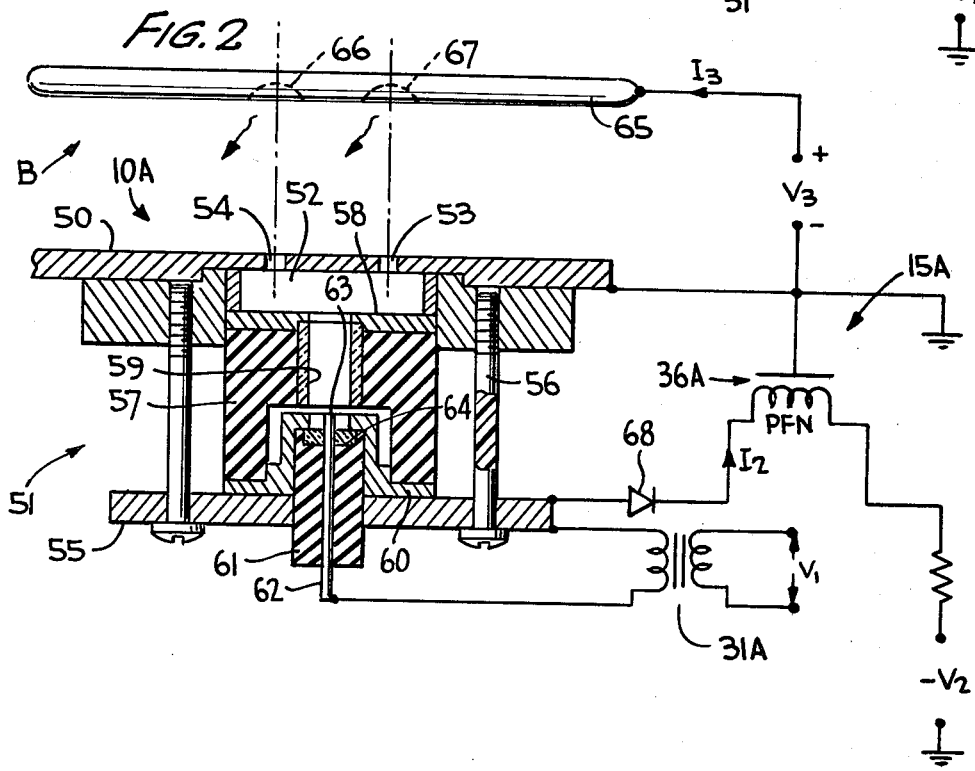

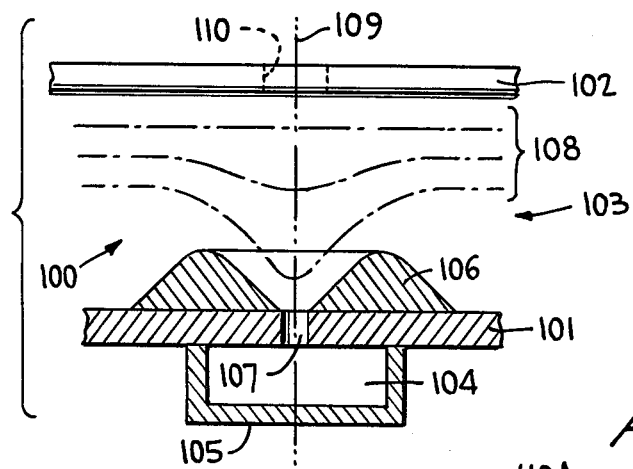
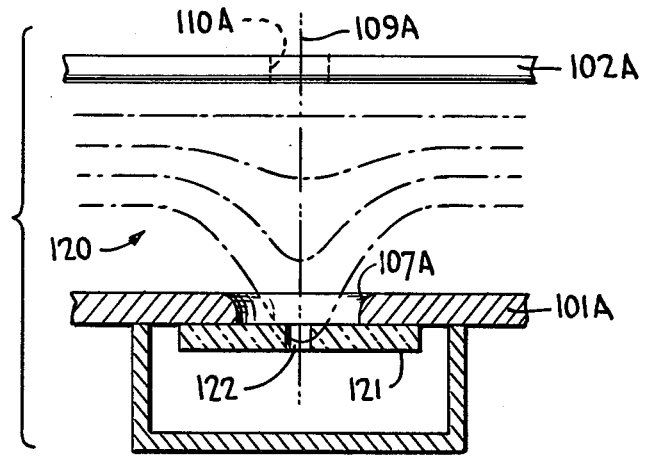
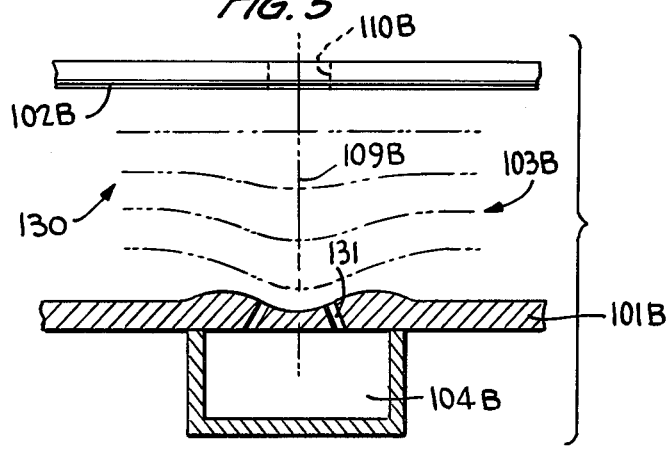

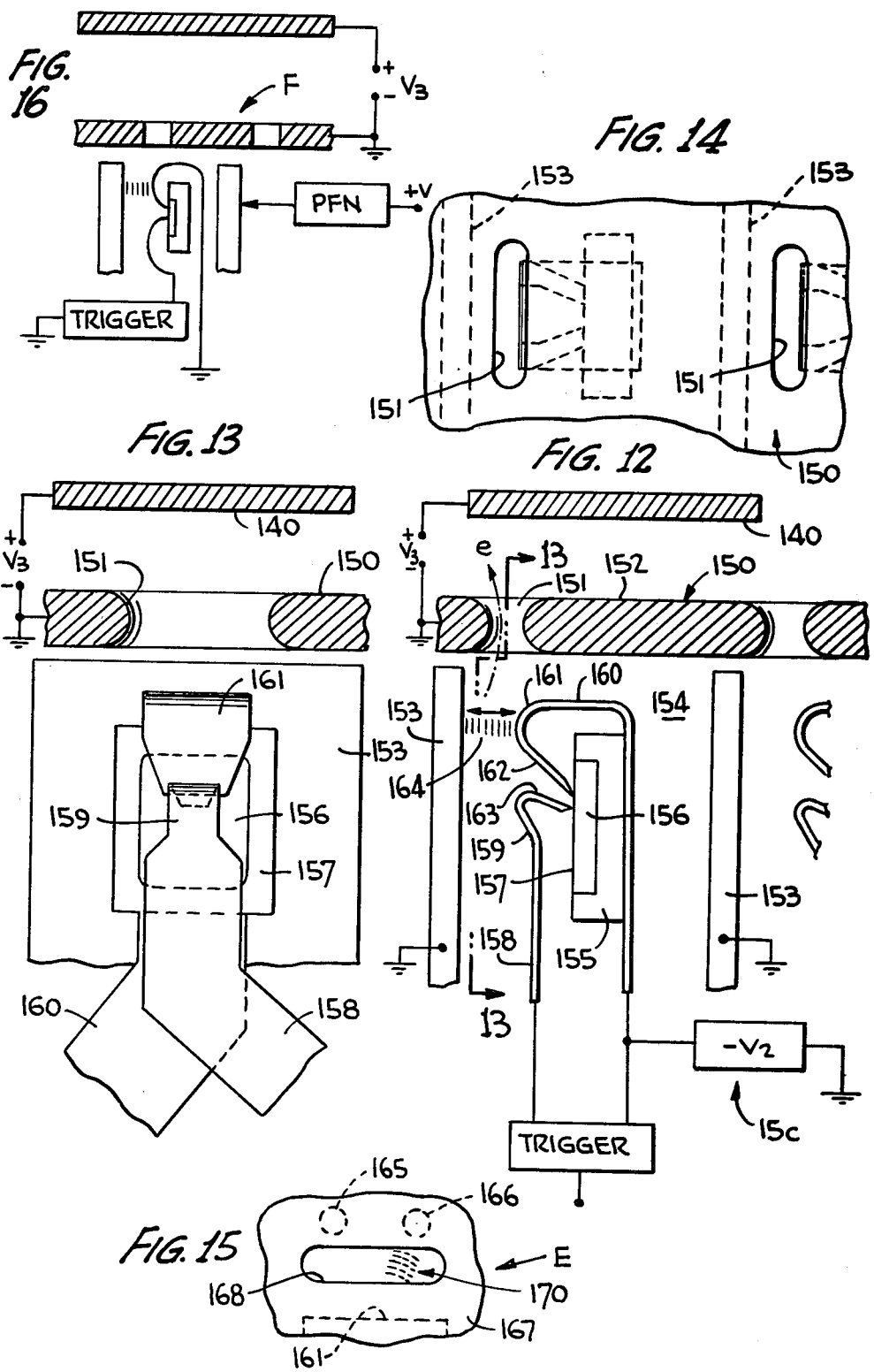

PLASMA ELECTRON SOURCE FOR COLD-CATHODE DISCHARGE DEVICE OR THE LIKE

TECHNICAL FIELD

This invention relates to a controllable plasma electron source for a cold-cathode discharge device or the like.

BACKGROUND ART

In a field-emission type of cold-cathode discharge device, the geometric configuration of the cathode locally enhances the electric field such that a burst of plasma is created at the cathode when a high-voltage pulse is applied between the anode and the cathode. The plasma so created propagates towards the anode at a speed of 1-3 cm/usec, short-circuiting the anode to the cathode, typically within a microsecond.

In a triggered cold-cathode discharge device, the geometry of the cathode and anode is such that a high voltage applied thereacross is insufficient in itself to create a plasma; rather, a trigger electrode is provided which, when pulsed with a short-duration, relatively low-level trigger, creates a burst of plasma. While the instant of firing of the last-mentioned device does not require a fast rise time high-voltage pulse, as does the field-emission device, the operating characteristics of each of these devices is identical in the sense that, once a plasma is created, it rapidly short-circuits the anode to the cathode.

For high-voltage switches, the rapid short-circuiting of the anode is advantageous, because switch closure time is important. However, once the cathode plasma has been created and the switch has been closed, all control over the operation of the switch is lost, because the plasma is self-sustaining, and cannot be turned off (and the switch reopened) without removal of the high voltage between the anode and the cathode. The inability of conventional devices to selectively turn the plasma on and off, and thus electrically close and open the switch, severely limits the applications of a high-voltage switch of this nature.

Because plasma is rich in electrons, a cold-cathode discharge device can function as an X-ray source. That is to say, if electrons contained in the plasma can be drawn from the plasma and accelerated towards the anode by the potential difference between the anode and the cathode, these electrons will impact the anode with sufficient energy to produce X-rays if the anode is of high-Z material. However, this situation can exist only until the plasma short-circuits the anode, with the result that the burst of X-rays produced will have a duration typically under 1 microsecond. Thus, conventional cold-cathode discharge devices have serious limitations, whether used as high-voltage switches or as X-ray sources.

It is, therefore, an object of the present invention to provide a new and improved cold-cathode discharge device which substantially overcomes the deficiencies in the prior art devices.

DISCLOSURE OF INVENTION

A plasma source according to the present invention includes a cathode having an aperture and a housing for defining a cavity behind the aperture in the cathode. A trigger electrode in communication with the cavity is responsive to a short-duration trigger pulse for establishing plasma in the cavity.

The design is such that the plasma is confined in the cavity and sustained subsequent to the termination of the trigger pulse by driving current through the plasma for a period of time relatively long as compared to the duration of the trigger pulse. In order to drive current through the plasma, an intermediate electrode is disposed between and electrically insulated from both the cathode and the trigger electrode, and a bias circuit is provided for biasing the intermediate electrode relative to the cathode subsequent to the termination of the trigger pulse, which typically is a 1-5 KV pulse of about 1 microsecond duration producing a current flow of about 60 A.

The bias circuit may include a pulse-forming network, or a current switch such as a field-effect transistor or the like, which biases the intermediate electrode at a negative voltage with respect to the cathode. The bias voltage may have a duration of the order of 50 microseconds, and a level of the order of from 100 volts to 1000 volts below the cathode. To sustain "follow on", which is the maintenance of the plasma created by the trigger pulse, the bias circuit should produce a current of about 10 A. When the bias circuit terminates current flow through the plasma, recombination occurs, and the plasma dissipates.

In the preferred form of the invention, the trigger electrode is mounted in an insulator that has a surface separating the trigger electrode from the intermediate electrode. When a trigger pulse is applied to the trigger electrode, surface flashover occurs across the insulator surface, thereby generating plasma in the cavity.

The plasma source according to the present invention can be used as part of a high-voltage switch, or as part of an X-ray source. In both cases, the source is used in combination with an anode spaced from the front surface of the cathode, and a high, positive voltage is applied to the anode relative to the cathode. The anode "sees" the plasma in the cavity through the aperture in the cathode; and electrons in the plasma are drawn to the anode through the aperture. The plasma is confined in the cavity by a combination of one or more of the following: (1) aperture size and thickness of the cathode; (2) the provision of a baffle in proximity to the aperture; (3) the relationship between the projected area of the baffle on the cathode and the area of the aperture; and (4) controlling the direction of plasma flow so that the flow is preferentially not directed through the aperture. When the bias circuit supplies a current of about 10 A to the plasma, the current flow between the cathode and the anode is about 1 A, and lasts as long as the bias. The magnitude of the electron current flow to the anode is determined by the bias current and the size of the cathode aperture. Thus, a major difference of the present invention over plasma sources of the prior art is the end state of the source: in the present invention, the end state is cessation of the plasma and termination of electron flow, while in the prior art, the end state is a continuation of the plasma and a short circuit between the anode and cathode.

Particularly when the plasma source is to be used as part of an X-ray source, wherein the anode is formed of a high-Z material, means are provided for focusing electrons which are drawn through the aperture in the cathode onto the anode. Focusing may be achieved by creating a potential well in the interelectrode space between the anode and the cathode in the vicinity of the aperture. A potential well can be created by providing a suitably shaped conductor on the surface of the cathode in the vicinity of the aperture, such as a Pierce gun-type geometry, or by providing an apertured non-conductor in the cavity.

BRIEF DESCRIPTION OF THE DRAWINGS

Embodiments of the present invention are shown in the accompanying drawings, wherein:

FIG. 1 is a sectional side view of a first embodiment of a plasma electron source according to the present invention;

FIG. 2 is a side elevational view according to a second embodiment of a plasma electron source of the present invention;

FIG. 3 is a sectional view of the cavity of a plasma electron source according to the present invention provided with a first embodiment for creating a potential well in the region between the cathode and the anode;

FIG. 4 is a sectional view of a cavity similar to that of FIG. 3, but showing a second embodiment for producing a potential well in the region between the cathode and the anode;

FIG. 5 is a sectional view of a modified version of a cavity for providing focusing without the use of a potential well;

FIG. 12 is a side sectional view of a further embodiment of the present invention ideally suited for a multiple array of plasma electron sources;

FIG. 13 is a front view of the embodiment of FIG. 12;

FIG. 14 is a top view of the embodiment of FIG. 12;

FIG. 15 is a fragmentary portion of another embodiment of the invention designed to provide control over focal spot size and electron beam intensity;

FIG. 16 is a schematic showing of a modification of the embodiment shown in FIGS. 12–14.

DETAILED DESCRIPTION

Figure 6:
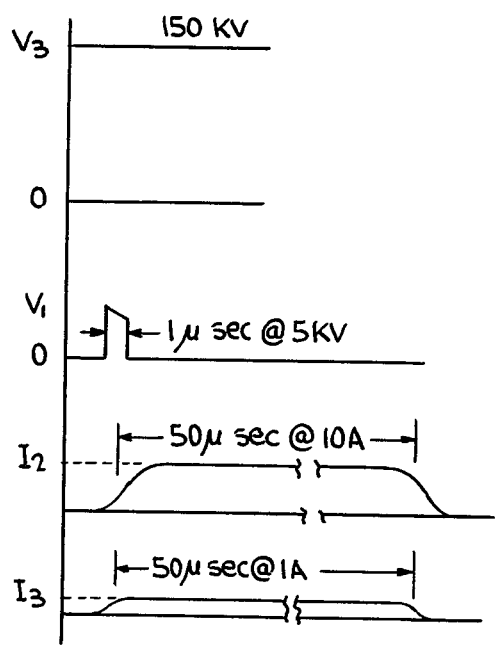
FIG. 6 is a timing diagram showing the relationship between a trigger pulse and the bias voltage that sustains the plasma.

Referring now to FIG. 1, reference numeral 10 designates a first embodiment of the plasma electron source according to the present invention, utilized as X-ray source A, such embodiment comprising an evacuated envelope (not shown) containing cathode 11 having aperture means in the form of a single aperture 12, and housing 13 for defining cavity 14 behind aperture 12. The cavity is typically about 1 cm in diameter and has about a 2 mm gap between the cathode and an intermediate electrode designated by reference numeral 20. Reference numeral 15 generally designates means for sustaining plasma in cavity 14, which is established in the manner to be described below.

Cathode 11 is a generally flat metallic plate having front surface 16 facing anode 17, which is shown as an elongated metallic rod overlying aperture 12, but which may take the form of a plate parallel to the front surface of the cathode. The rear surface of the cathode is counterbored at 18 for receiving upstanding cylindrical walls 19 of intermediate electrode 20, which is rigidly connected to the back surface of cathode 11 by non-metallic bolts 21, insulating bushings 22 serving to electrically isolate intermediate electrode 20 from the cathode. Cylindrical walls 19 are concentric to axis 23 of aperture 12 in the cathode.

Counterbored conical hole 24, at the base of walls 19, is concentric to walls 19, and terminates in axial aperture 25, concentric with axis 23, providing clearance for trigger electrode 26 mounted in insulating bushing 27 carried by end plate 28, fastened to intermediate electrode 20. Ceramic, non-metallic disc-washer 29 contained in bushing 27 surrounds the base of portion 34 of the trigger electrode, and defines a surface that separates the trigger electrode from the surface of intermediate electrode 20, defined by aperture 25.

Trigger electrode 26 is connected to intermediate electrode 20 by secondary 30 of pulse transformer 31, whose primary 32 is connected to a selectively operable trigger source (not shown) for selectively applying a 1–5 KV trigger pulse lasting about 1 microsecond to the trigger electrode. Diode 37 electrically isolates the trigger pulse from means 15 for sustaining the plasma. As shown in FIG. 1, cathode 11 is connected to ground 33, with the result that, upon the application of a trigger pulse to the trigger electrode, surface flashover takes place across the surface of ceramic disc 29 between portion 34 of the trigger electrode associated with cavity 14, on the one hand, and the surface of the intermediate electrode defined by hole 25, on the other hand.

It is presently believed that once surface flashover takes place, an arc is initiated between the trigger electrode and an adjacent surface on the intermediate electrode, the origin of the arc thereon being termed the "cathode spot". Metallic ions from the cathode spot establish a plasma in cavity 14, the plasma so generated containing electrons which can be drawn out of the cavity through aperture 12 by the electric field in the interelectrode region between anode 17 and cathode 11 created by the voltage $V_3$ applied as indicated.

The volume and configuration of the cavity, the location of the origin of the arc on the intermediate electrode (cathode spot) relative to the aperture in the cathode, and the size and configuration of the aperture, as well as the depth of the aperture in the cathode, contribute to limiting the escape from the cavity of ions and neutrals in the plasma. By thus suppressing the escape of ions and neutrals into the interelectrode space between the cathode and the anode, the present invention provides means for confining the plasma to the cavity.

In the absence of means 15 for sustaining the plasma in cavity 14, the plasma in the cavity, comprising primarily metallic vapor furnished by the intermediate electrode, will extinguish by recombination within a few microseconds. For the duration of the plasma, electrons from the cavity drawn through aperture 12 will impact on anode 17. When the anode is of high-Z material and the voltage $V_3$ is large enough, the electrons that impact on the anode will illuminate region 35 of the anode to produce X-rays which radiate omnidirectionally. However, the X-rays so produced will last only until the plasma is extinguished; in this case, for no more than a few microseconds.

Means 15, according to the present invention, provides for preventing the extinguishment of the plasma subsequent to the termination of the trigger pulse for a period of time relatively long with respect to the trigger pulse. As shown in FIG. 1, means 15 includes pulse-forming network 36 connected between bias voltage $V_2$ and intermediate electrode 20. In operation, the selective triggering of transformer 31 by trigger voltage $V_1$ produces a plasma in cavity 14 in the manner described above. At the same time, the application of bias signal $V_2$ to the pulse-forming network 36 drives current through the plasma in cavity 14, the circuit being completed through cathode 11 and ground 33. As shown in FIG. 6, the duration of the trigger pulse is about 1 microsecond and the resultant current flow about 60 A, while the duration of the output of pulse-forming network 36 is a voltage, of between about 100 and 1000 volts negative with respect to the cathode, lasting about 50 microseconds. At the present time, a voltage of about 500 volts appears to be optimal. The current furnished by the pulse-forming network sustains the plasma in cavity 14 for the duration of the output of pulse-forming network 36. As a consequence, the plasma created in cavity 14 lasts as long as the output of the pulse-forming network, which is many times longer than the lifetime of plasma produced by the trigger without the presence of means 15 for sustaining the plasma.

Because the plasma can be sustained in the cavity for a relatively long period of time, electrons in the plasma can be drawn out over this period of time through the aperture in the cathode for impacting on the anode and producing X-rays in the manner described above. The time during which X-rays are produced will thus depend on the electrical length of the pulse-forming network. While a 50-microsecond pulse has been described, it is apparent that the electrical length of the pulse from the network can be of any practical value in order to control the duration of X-rays produced by spot 35 on the anode.

Figure 10:
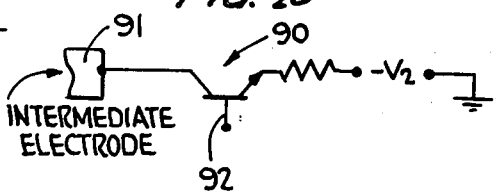
FIG. 10 is a modified bias circuit for effecting "follow on" of the plasma.

Instead of utilizing a pulse-forming network to provide a means for sustaining the plasma in the cavity subsequent to the termination of the trigger pulse, a high-voltage field-effect transistor (FET) or other active element can be utilized to control the turn-off of the plasma. FIG. 10 shows an arrangement in which transistor 90 is interposed between intermediate electrode 91 of a source like the sources of A, B, or C and voltage $V_2$, which is selectively applicable to the intermediate electrode by reason of a control signal applied to control electrode 92 of the transistor. This arrangement provides greater flexibility in establishing the duration of the plasma in the cavity as compared to the pulse-forming network, which has a fixed time-span, and is not variable without a complex arrangement that would require tapping of the pulse-forming network. As a further modification, a pulse-forming network having a time-variable current drive can be utilized in order to vary the anode-cathode current. When the source is used to generate X-rays, this arrangement can be utilized to tailor the temporal nature of the X-ray burst produced at the anode.

When the bias circuit furnishes about 10 A of current through the plasma to sustain it, the electron flow from the cathode to the anode will be about 1 A. This electron flow will determine the X-ray flux, which can be varied in accordance with the level of current furnished by the bias circuit.

The invention is also applicable to a high-voltage switch, which is turned on by the application of a trigger pulse to the trigger electrode, and which is turned off when the sustaining current through the plasma, provided by pulse-forming network 36, is interrupted. In this manner, the accurately-timed opening of a high-voltage switch, as well as its closing, can be achieved in a particularly simple manner.

As an alternative in sustaining the plasma created in cavity 14, the source driving primary 32 of pulse transformer 31 can be selected so as to rapidly and repeatedly pulse the trigger transformer, the plasma being sustained by repeated pulses applied to the trigger electrode.

A second embodiment of the invention is shown as part of X-ray source B in FIG. 2 wherein source 10A comprises cathode 50, housing 51 located behind the cathode for defining cavity 52 located behind apertures 53 and 54 in the cathode, and means 15A for sustaining plasma in cavity 52. In this embodiment, housing 51 includes intermediate electrode 55, which is connected by non-metallic bolts 56 to the cathode, but is insulated therefrom by insulating bushing 57. Cavity 52 is defined by a cup-shaped metallic member 58 connected to the back surface of the cathode, and having a central aperture for receiving capillary tube 59 composed of an insulating material such as alumina. Centrally-located metallic boss 60, connected to the intermediate electrode, supports non-conductive bushing 61, whose axis is coincident with the axis of capillary tube 59. Free end 63 of trigger 62 extends somewhat above the surface of ceramic disc 64 mounted in of insulating bushing 61, as shown in the drawing.

As in the case of the embodiment shown in FIG. 1, the secondary of pulse transistor 31A is connected between trigger 62 and intermediate electrode 55, so that a trigger pulse of 1–5 KV can be applied selectively between the trigger electrode and the intermediate electrode. When such a trigger pulse is applied, surface flashover occurs across the surface of ceramic disc 64 between the free end 63 of the trigger electrode and the metallic surface of boss 60, initiating plasma, which travels into capillary tube 59 and enters cavity 52.

The plasma is sustained by the operation of means 15A, in that pulse-forming network (PFN) 36A applies a relatively long-duration, relatively low-amplitude bias, the current passing through the metallic portions of the intermediate electrode, the plasma, and then into the cathode and to ground. The PFN is electrically isolated from the trigger pulse by diode 68. The bias sustains the plasma within the capillary, and the inner surface of the capillary tube stabilizes the plasma and provides a source of plasma ions to cavity 52. Electrons in the plasma in cavity 52 are drawn out through apertures 53 and 54 in the cathode, and are accelerated toward anode 65 by reason of the voltage $V_3$. Because two apertures are provided, two focal spots 66, 67 are formed where the electrons impact the anode, providing two sources of X-rays when the voltage $V_3$ has a sufficient value and a high-Z material is used for the anode.

Figure 8:
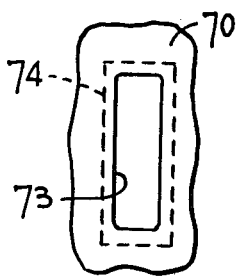
FIG. 8 is a view taken along line 8–8 of FIG. 7 illustrating the cathode aperture configuration.
Figure 7:
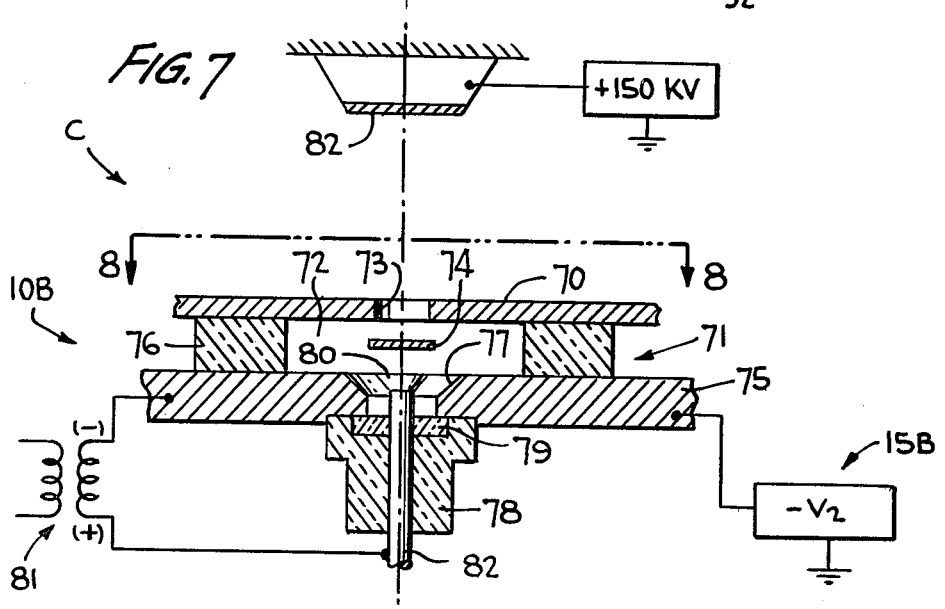
FIG. 7 is a side view of a third embodiment of a plasma electron source according to the present invention.

A third embodiment of the invention is shown as part of X-ray source C in FIG. 7, wherein plasma electron source 10B comprises cathode 70 and housing 71 located behind the cathode for defining cavity 72 positioned behind aperture 73 in the cathode, which, as shown in FIG. 8, is in the shape of an elongated rectangle. Means 15B is provided for sustaining plasma in cavity 72 in the manner described previously. Baffle 74 is located within the cavity in proximity to aperture 73, as indicated in FIG. 8, and provides a means for confining the plasma to the cavity. The baffle may have a projected area larger than the aperture.

Housing 71 includes intermediate electrode 75, which is spaced from the cathode by insulating bushing 76. The front face of intermediate electrode 75 facing the cathode is countersunk at 77; and the rear face of the electrode is provided with a counterbore for receiving insulating bushing 78. Trigger electrode 82 is mounted in a central aperture in bushing 78, and extends upwardly through ceramic disc-water 79 into the countersunk region 77, terminating in enlarged head 80 that is bevelled downwardly, as shown in the drawing.

In operation, the application of a trigger pulse to isolation transformer 81 will result in a surface flashover condition across the exposed surface of washer 79 between the base of enlarged head 80 of the trigger electrode and the cylindrical surface of countersunk region 77. The foot of the trigger arc (called the cathode spot) thereby created initially originates on the intermediate electrode at the bottom of the cylindrical hole of region 77, but rapidly walks up the walls away from the ceramic disc, eventually stabilizing on the conical surface defining region 77. Because of the final location of the cathode spot, the ceramic disc is shielded from sputter products from the intermediate electrode. Consequently, no metallic deposit on the ceramic disc builds up, with the result that the life of the source is extended. The enlarged "hat" on the trigger electrode serves a similar function in extending the trigger electrode lifetime.

The plasma produced in the cavity by reason of metallic ions generated at the cathode spot by the arc propagates through the cavity; and baffle 74 serves to shield aperture 73 against the escape of ions and neutrals created by the interaction of electrons and ions. The thickness of the cathode 70 serves as a collimator to prevent the escape from the cavity of all particles except those having a trajectory almost perpendicular to the plane of the cathode. In effect, the plasma flows past the aperture, and only electrons in the plasma are affected by the high voltage that exists between anode 82 and the cathode. Consequently, only electrons are extracted from the plasma, which is confined to cavity 72.

Figure 9:
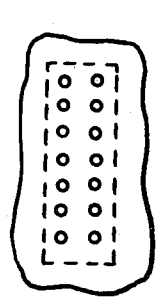
FIG. 9 is another embodiment of the cathode aperture configuration.

To increase the collimating effect of the aperture in the cathode, the aperture configuration shown in FIG. 9 can be utilized. In this case, the single large aperture is replaced by a plurality of smaller apertures to thereby further suppress the passage of ions and neutrals in the plasma into the interelectrode space between anode 82 and cathode 70. By preventing the plasma and neutrals from the cavity from streaming out of the aperture into the interelectrode space, shorting out of the anode/cathode gap is precluded. Thus, by sustaining the plasma in the cavity by reason of the operation of circuit 15B, electrons can be extracted from the plasma for a relatively long period of time, permitting, when the voltage on the anode is sufficiently high, the generation of X-rays on a sustained basis.

In actual practice, sources A, B, C, and D (FIGS. 1, 2, 7, and 12, respectively) would be contained in an evacuated envelope (not shown). The vacuum requirement for this envelope would be relatively modest, and would be of the order of $5 \times 10^{-3}$ TORR or lower.

The sources described above are well suited for computerized tomography, because a plurality of these sources can be arranged circumferentially around a central axis in a closely-packed arrangement.

In some cases, it may be desirable to focus the electron beam emanating from the apertures in the cathode onto a particular portion of an anode. Techniques for achieving this result are shown in FIGS. 3–5. Referring now to FIG. 3, reference numeral 100 designates an X-ray source comprising an apertured cathode 101 spaced from anode 102 and a suitable source (not shown) connected between the cathode and the anode producing a strong electric field in the interelectrode space 103. Behind cathode 101 is cavity 104, defined by housing 105. The cavity may be in the forms shown in FIG. 1, FIG. 2, FIG. 7, or FIG. 12.

On the front surface of cathode 101 is metallic structure 106, concentrically mounted with respect to aperture 107. The presence of structure 106 creates a potential well in interelectrode space 103, as suggested by equipotential lines 108. The presence of a potential well centered on the axis 109 defined by the axis of aperture 107 will modify the initial trajectory of electrons emerging from the aperture, causing them to be focused on central region 110 of anode 102, thereby effecting a focusing of the electrons.

X-ray source 120, shown in FIG. 4, is similar to source 100 shown in FIG. 3, except that aperture 107A in cathode 101A is enlarged, and is backed by insulating plate 121, which has aperture 122 aligned with axis 109A. Aperture 122 is considerably smaller than aperture 107A, and is of the same order of size as aperture 107 in the embodiment shown in FIG. 3. Because plate 121 is non-conductive, the electric field will penetrate into the non-conductive plate, causing a potential well to develop similar to that shown in FIG. 3. As indicated, this potential well will focus electrons on central region 110A of anode 102A of the source.

X-ray source 130, shown in FIG. 5, provides for focusing of electrons drawn from cavity 104B through aperture means in cathode 101B. Specifically, the aperture means in the cathode of source 130 comprises a potential well and a plurality of small apertures 131, each of which is inclined with respect to axis 109B, the axes of apertures 131 pointing in the general direction of, and defining, focal spot 110B. By dividing the electron current among a plurality of apertures 131, as shown in FIG. 5, instead of a single aperture 107, as shown in FIG. 3, the space charge repulsive effects, which counteract focusing, are reduced.

Figure 11:
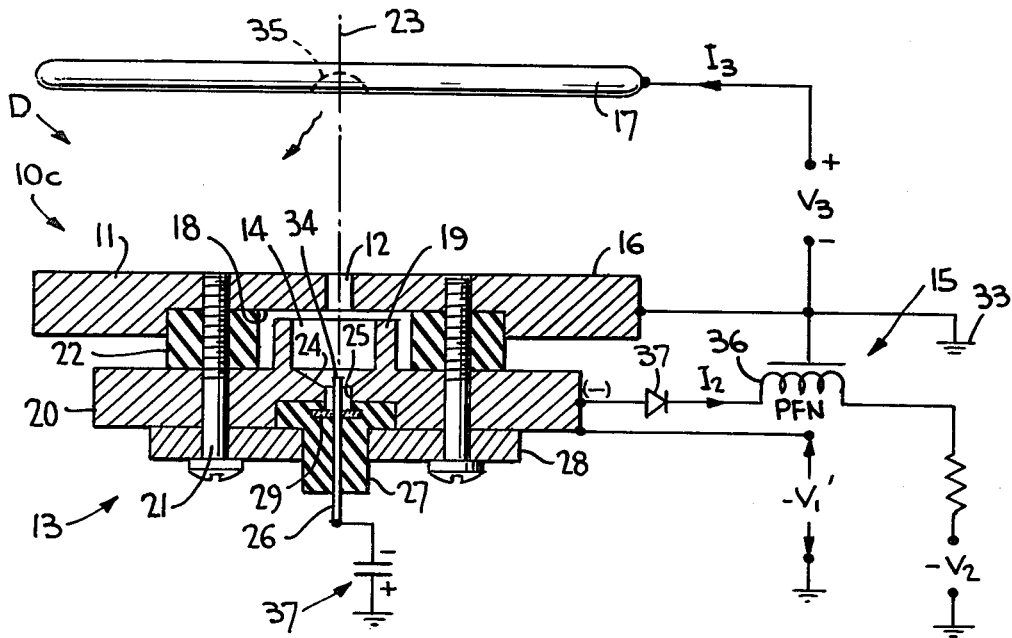
FIG. 11 is a sectional side view of a further embodiment of the present invention showing a modification of the device shown in FIG. 1, which eliminates the necessity for a pulse transformer.

In the embodiments previously described, a pulse transformer is utilized between the intermediate electrode and the trigger electrode for the purpose of applying to the trigger electrode a short-duration trigger pulse sufficient to establish a plasma in the cavity of each of the embodiments. FIG. 11, to which reference is now made, discloses X-ray source D wherein the need for a pulse transformer for applying the trigger pulse is eliminated. X-ray source D is similar in design to X-ray source A, and like reference numerals are used in FIG. 11 for elements that are common to both FIGS. 1 and 11. In the embodiment shown in FIG. 11, however, capacitor 37 is interposed between trigger electrode 26 and ground, and a voltage $V_1'$ is selectively applied to intermediate electrode 20 at the instant source 10C is to be fired. Due to the rapid rise of the trigger pulse, capacitor 37 appears as a short-circuit to ground, allowing flashover to occur cross the surrounding washer 29 in the region between surface 25 of the intermediate electrode and the trigger electrode. Once the voltage pulse applied to the intermediate electrode disappears, the trigger electrode is electrically disconnected from ground by the capacitor, allowing bias circuit 15 to supply current to the plasma, thereby sustaining it.

A plasma electron source which can be built in a multiple array with a spacing of less than 1 cm, and which is particularly simple and easy to manufacture, is shown in FIG. 12, to which reference is now made. X-ray source D show in FIG. 12 includes anode 104 and plasma electron source 149 comprising cathode 150, which is a unitary strip of metal containing apertures 151 that are spaced at intervals of, say, less than 1 cm. Below the outer surface 152 of the cathode are a plurality of cavities 154, defined by the spaces between adjacent auxiliary electrodes 153, which may be connected electrically to the cathode, or which may be biased, either positively or negatively, with respect to the cathode. Each cavity 154 beneath cathode 150 is shielded from the anode (not shown) by the bulk of the cathode. The relationship between the spacing of the auxiliary electrodes 153 and apertures 151 is such that an aperture is located adjacent one of the auxiliary electrodes, as shown in FIG. 12.

Contained within cavity 154 is ceramic carrier 155 on which ceramic disc 156 is mounted, defining surface 157 that is substantially parallel to the surface of auxiliary electrode 153. Trigger electrode 158 is a cantilevered flat metallic strip that terminates in hook-shaped section 159, the free end of which is chisel-pointed, and engages surface 157. Intermediate electrode 160 is also a flat metallic strip having curved portion 161 adjacent auxiliary electrode 153, and terminating in a straight portion, whose chiselled free end engages surface 157 at a location spaced from the location at which the chisel-point termination of trigger electrode 158 engages surface 157. The free ends of the trigger and the intermediate electrodes thus define a pair of opposite faces 162 and 163, the spacing between which increases in a direction away from surface 157.

In operation, the application of a trigger pulse between trigger electrode 157 and intermediate electrode 160 causes flashover to occur on surface 157 between the chiselled points of the electrodes where they engage the ceramic disc 156. The arc so formed is driven away from surface 157 between the faces 162 and 163 by hydrodynamic and self-magnetic forces, so that, when the bias circuit 15C becomes effective, the arc has moved to a location between curved portion 161 and auxiliary electrode 153 in the region opposite the curved portion. The arc stabilizes in this position as bias circuit 15C continues to supply current. As a result of the construction and arrangement of the intermediate electrode and the auxiliary electrode, the stabilized arc, which is illustrated schematically by reference numeral 164, is oriented, generally, in a direction parallel to surface 152 of the cathode. As a consequence, the general flow of ions, neutrals, and electrons in arc 164 is in a direction that tends to maintain a flow in a direction across or transverse to the opening 151, which overlies the arc. Consequently, the presence of a high voltage between an anode and the cathode will cause electrons within the plasma to be drawn from cavity 154, and into the cathode-anode space through aperture 151. Thus, the configuration shown in FIG. 12 is particularly useful in confining the plasma to a cavity. Furthermore, ceramic disc 156 is protected from metallic sputter from arc 164 by the disclosed arrangement, which permits the arc to "walk away" from its origin. Because both portions 159 of trigger electrode 158 and curved portion 161 of intermediate electrode 160 are mounted in cantilevered fashion, the contact points are biased into engagement with surface 157, and any disintegration of the chiselled points of these two electrodes as a consequence of repeated firing of the source will not interfere with its operation.

In order to further enhance the ability of the embodiment shown in FIG. 12 to confine the plasma in cavity 154, the region on auxiliary electrode 153 where the stabilized arc contacts the auxiliary electrode may be curved to provide a cup-shaped recess.

Furthermore, the auxiliary electrodes need not be flat, plate-like members, but may be in the form of rods 165, 166 disposed perpendicular to the plane of cathode 167 of X-ray source E, as shown in FIG. 15. In such case, the rods are out of alignment with aperture 168 in the cathode, and are spaced apart in a direction generally parallel to the direction of the elongated opening that defines aperture 168.

Each of the rods is connected to separate pulse-forming networks (not shown) so that either or both can be activated to supply current to a plasma created in the cavity beneath aperture 168 in the manner previously described. That is to say, the application of a trigger pulse that causes surface flashover to occur on surface 157 will result in the creation of an arc between the intermediate electrode (not shown) and one or the other, or both, auxiliary electrodes 165, 166, depending on which of the two pulse-forming networks is activated. If a relatively small focal spot size is desired, or if a relatively small electron beam current is desired, only one of the pulse-forming networks is activated, say, the one connected to rod 166. The result is an arc that extends between the intermediate electrode and rod 166, as indicated at 170. In this manner, only a limited plasma will be created in the cavity, and the number of electrons drawn from this plasma through the aperture 168 will be limited, as compared to the situation that exists in the embodiment of FIGS. 12-14. An increase in the beam current can be achieved, however, by activating the pulse-forming network connected to rod 165, which establishes an arc terminating at this rod.

In X-ray source F, shown in FIG. 16, the auxiliary electrodes are of the type shown in FIGS. 12-14; but in this case, a pulse-forming network is connected to the auxiliary electrodes rather than to the intermediate electrodes. The operation is, however, the same as in the embodiment shown in FIGS. 12-14.

Figure 17:
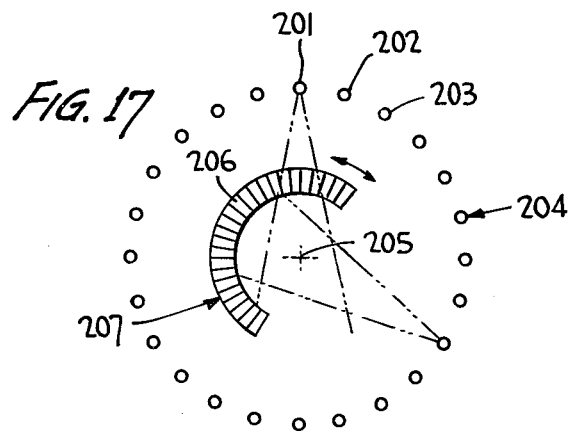
FIG. 17 is a schematic representation of a CT scanner in which the X-ray source is in the form of a circular source ring of X-ray sources of the type shown in any of FIGS. 1, 2, 7, 11, and 12, and the detectors are mounted on a rotatable detector ring with a diameter smaller than that of the source ring.

The plasma electron sources shown in FIGS. 12-16 are particularly useful in a CT scanner, which is shown schematically in FIG. 17. The CT scanner comprises a plurality of X-ray sources 201, 202, 203, etc. mounted on a source ring 204, whose axis defines the axis 205 of the scanner. Additionally, a plurality of detectors 206 are mounted on a rotatable detector ring 207, whose diameter is smaller than that of the source ring, for receiving X-rays from the sources. The detector ring has an axis colinear with the axis of the source ring. To provide clearance, the plane of the detector ring may be displaced from the plane of the source ring.

As shown in FIG. 17, the ability to fire each source in a selective manner permits different groups of detectors, defined by the fan beam of radiation produced by a source, to be illuminated in a way that permits the detectors of one group to recover before being illuminated once again. For example, if source 201 is fired, followed by source 203, the group of detectors illuminated by the fan beam of radiation produced by source 201 will have time to recover before being illuminated by the fan beam produced by source 202. Thus, the non-sequential firing of the sources will materially speed up the acquisition of data in the CT scanner, inasmuch as the recovery time of the detectors does not control the timing between the firing of the sources.

It is possible to utilize an array of the plasma electron sources described previously in a common vacuum chamber in order to form an array of sources. In such case, the array could be circular, and, by a similar configuration of a continuous anode, X-rays could be produced from various focal spots on the anode such that each focal spot produces a fan beam of radiation lying in a common plane passing through the axis of the circular arrangement of sources.

It is believed that the advantages and improved results furnished by the method and apparatus of the present invention are apparent from the foregoing description of the preferred embodiment of the invention. Various changes and modifications may be made without departing from the spirit and scope of the invention as described in the claims that follow.

What is claimed is:

1. A plasma electron source for a vacuum device comprising:
   (a) a cathode having aperture means;
   (b) a housing for defining a cavity behind said aperture means;
   (c) a trigger electrode in communication with the cavity, and responsive to a short-duration trigger pulse for establishing plasma in the cavity; and
   (d) means for confining the plasma to the cavity.

2. A plasma electron source according to claim 1 including means for sustaining the plasma in the cavity subsequent to the termination of the trigger pulse.

3. A plasma electron source according to claim 2 wherein the means for sustaining the plasma includes means for driving current through the plasma for a period of time relatively long as compared to the duration of the trigger pulse.

4. A plasma electron source according to claim 3 including an intermediate electrode disposed between and electrically insulated from both the cathode and the trigger electrode, and wherein the means for sustaining the plasma includes a bias circuit for biasing the intermediate electrode relative to the cathode.

5. A plasma electron source according to claim 4 wherein the bias circuit includes a pulse-forming network that biases the intermediate electrode at a negative voltage with respect to the cathode.

6. A plasma electron source according to claim 5 wherein the bias relative to the cathode is in excess of 100 volts.

7. A plasma electron source according to claim 6 wherein the duration of the trigger pulse is of the order of 1 microsecond.

8. A plasma electron source according to claim 7 wherein the duration of the bias voltage is of the order of 50 microseconds.

9. A plasma electron source according to claim 3 wherein the means for driving current through the plasma includes means for rapidly and repeatedly applying trigger pulses to the trigger electrode.

10. A plasma electron source according to claim 4 wherein the trigger electrode is associated with an insulator that has a surface separating the trigger electrode from the intermediate electrode, and across which surface flashover takes place when a trigger pulse is applied to the trigger electrode for generating a plasma in the cavity.

11. A plasma electron source according to claim 10 wherein the cavity is defined, at least in part, by a cylindrical conductive member that constitutes the intermediate electrode, the trigger electrode being a rod that is coaxial with the cylindrical conductive member.

12. A plasma electron source according to claim 11 wherein the cavity is defined, at least in part, by a cylindrical non-conductive member interposed between the intermediate electrode and the cathode.

13. A plasma electron source according to claim 11 wherein the cavity is defined, at least in part, by a conductive cup-shaped member electrically isolated from the cathode and interposed between the non-conductive member and the cathode.

14. A plasma electron source according to claim 10 wherein the trigger electrode has an enlarged head that tapers toward the insulator.

15. A plasma electron source according to claim 10 wherein the head of the trigger electrode sits in a countersunk recess in the intermediate electrode.

16. A plasma electron source according to claim 15 wherein the countersunk recess has a conical surface that tapers towards the insulator.

17. A plasma electron source according to claim 10 wherein each of the trigger and intermediate electrodes have free ends that engage said surface on said insulator.

18. A plasma electron source according to claim 17 wherein the cathode defines a surface, and said surface on said insulator is non-parallel to the surface defined by the cathode.

19. A plasma electron source according to claim 18 wherein said surface on said insulator is substantially perpendicular to the surface defined by the cathode.

20. A plasma electron source according to claim 19 wherein the free ends of the trigger and intermediate electrodes define a pair of opposite faces, the spacing between which increases in a direction away from said surface on said insulator.

21. A plasma electron source according to claim 20 including an auxiliary electrode in the cavity, and wherein the intermediate electrode has a curved portion adjacent the auxiliary electrode, one of the last-mentioned electrodes being electrically connected to said bias circuit whereby the arc produced in the cavity subsequent to flashover stabilizes in the space between said curved portion and said auxiliary electrode.

22. A plasma electron source according to claim 21 wherein the bias circuit is connected to the intermediate electrode.

23. A plasma electron source according to claim 21 wherein the bias circuit is connected to the auxiliary electrode.

24. A plasma electron source according to claim 21 wherein the auxiliary electrode has a plurality of components connected to respective ones of a plurality of bias circuits that are selectively actuatable.

25. A plasma electron source according to claim 21 wherein the auxiliary electrode and the curved portion of the intermediate electrode are constructed and arranged so that the stabilized arc is oriented, generally, in a direction parallel to said surface on the cathode.

26. A plasma electron source according to claim 25 wherein the aperture means in the cathode overlies said space between said curved portion and said auxiliary electrode.

27. A plasma electron source according to claim 4 wherein the secondary of a pulse transformer is coupled to the trigger electrode.

28. A plasma electron source according to claim 4 wherein the bias circuit includes an active element having a control terminal for controlling the state of the elements, the active element being connected between the intermediate electrode and a negative voltage for applying the latter to the intermediate electrode when a control signal is applied to the control terminal.

29. A plasma electron source according to claim 4 wherein a capacitor is coupled to the trigger electrode.

30. A plasma electron source according to claim 5 wherein the pulse-forming network produces a pulse whose amplitude varies with time.

31. A plasma electron source according to claim 5 wherein the pulse-forming network produces a pulse of uniform amplitude.

32. A high-voltage switch comprising the plasma electron source of either claim 1 or claim 2 in combination with an anode spaced from the front surface of the cathode of said source, and means for applying a high positive voltage to the anode relative to the cathode, whereby electrons in the plasma in the cavity are drawn to the anode through the aperture therein.

33. A plasma electron source according to claim 1 wherein the means for confining the plasma to the cavity is a baffle located in the cavity in the vicinity of the aperture means.

34. A plasma electron source according to claim 33 wherein the projected area of the baffle on the cathode comprehends an area larger than the area of the aperture means.

35. A plasma electron source according to claim 1 wherein the aperture means includes a plurality of apertures inclined relative to the front surface of the cathode.

* * * * *